United States Patent [19]
Grace et al.

[11] 3,714,605
[45] Jan. 30, 1973

[54] BROAD BAND HIGH EFFICIENCY MODE ENERGY CONVERTER

[75] Inventors: Martin I. Grace, Framingham, Mass.; Harry Kroger, Sudbury, Mass.; Harold J. Pratt, Andover, all of Mass.

[73] Assignee: Sperry Rand Corporation

[22] Filed: Dec. 30, 1970

[21] Appl. No.: 102,738

[52] U.S. Cl. ....................331/107 R, 331/56, 331/96, 331/101, 333/73 C, 333/84 M
[51] Int. Cl. ....................H03b 7/14
[58] Field of Search....................331/56, 101, 96, 107

[56] References Cited

UNITED STATES PATENTS

| | | | |
|---|---|---|---|
| 3,571,750 | 3/1971 | Carlson | 331/56 |
| 3,605,034 | 9/1971 | Rucker | 331/56 |

OTHER PUBLICATIONS

IEEE Trans Microwave Theory, pgs 982–983, Nov. 1970.
S.LIV, Trans Microwave Theory, pgs 1068–1071, Dec. 1969.
S.LIV, Trans Microwave Theory, pgs 1068–1071, W. J. Evans, Dec. 1969, pg 1060–1067.
Electronic Letters, Pratt; pgs 467–468, Oct. 2, 1969.
Electronic Letters, Thomson, pgs 229–230, Mar. 29, 1969.
Electronic Letters, Giblin, pgs 361–363 Aug. 7, 1969.

*Primary Examiner*—John Kominski
*Attorney*—S. C. Yeaton

[57] ABSTRACT

An active high-efficiency-mode semiconductor diode energy converter for generating and amplifying high frequency electromagnetic energy over a broad band frequency band utilizes balanced circuits affording independent tuning of signals at the several important frequencies for high-efficiency mode operation.

3 Claims, 8 Drawing Figures

INVENTORS
MARTIN I. GRACE
HARRY KROGER
HAROLD J. PRATT JR.
BY
H P Terry
ATTORNEY INVENTORS
MARTIN I. GRACE
HARRY KROGER
HAROLD J. PRATT JR.
BY
HP Terry
ATTORNEY INVENTORS
MARTIN I. GRACE
HARRY KROGER
HAROLD J. PRATT JR.
BY
H P Terry
ATTORNEY INVENTORS
MARTIN I. GRACE
HARRY KROGER
HAROLD J. PRATT JR.
BY
H P Terry
ATTORNEY

BROAD BAND HIGH EFFICIENCY MODE ENERGY CONVERTER

CROSS REFERENCE

This invention is an improvement over a generic invention disclosed and claimed in the M.I. Grace U.S. Pat. No. 3,646,581, issued Feb. 29, 1972 and assigned to the Sperry Rand Corporation.

BACKGROUND OF THE INVENTION

1. Field of the Invention

The invention pertains to high frequency transmission line balanced semiconductor diode energy converters and more particularly relates to means in such semiconductor energy converters for permitting high-efficiency-mode operation of such converters over a wide frequency band as amplifiers or tunable oscillators.

2. Description of the Prior Art

High-efficiency-mode semiconductor diode energy converters of the prior art have been demonstrated in both coaxial or other hollow transmission line forms. Circuits employed in such converters provide interaction yielding both fundamental and harmonic energy at the location of the high-efficiency-mode diode in the particular relation required by the diode for efficient energy conversion. In other words, these circuits are capable of placing the diode in an oscillating electromagnetic field simultaneously having electric field components at a fundamental frequency $f_F$ and at harmonics $f_H$ thereof. Such coaxial line and hollow wave guide circuits become difficult to make and to adjust at increasingly high carrier frequencies because of their small size. The problems associated with devising suitable means of independently matching, tuning, and otherwise adjusting the individual parts of the circuit in which fundamental and harmonic signals mutually or separately flow also become increasingly difficult.

A further problem associated with such prior art circuits is concerned with their highly dispersive characteristics, such circuits having large reactive variations with frequency. Where a device is to be operated as an amplifier or tunable oscillator, rapid change in circuit reactance as a function of frequency severely limits the possible band width. Accordingly, repeatably attainable band widths with operation free of distorting effects have been quite narrow and have previously been extended to values as high as five per cent only by extreme care in making tuning and other circuit adjustments.

SUMMARY OF THE INVENTION

The invention is a microwave or high frequency signal converter employing balanced high-efficiency-mode semiconductor diodes as active negative resistance devices in a transmission line network. A network placed adjacent the location of the diodes has a stop band containing certain harmonics$f_H$ of the frequency $f_F$ of the signal to be amplified, while being transparent to the latter signal. The network is tuned to resonate the signal frequency $f_F$ to be amplified. The network employs electrically short lumped constant elements, along with making constructive use of the equivalent diode circuits, to provide wide band operation, the impedance characteristics of the circuits in the vicinity of the frequencies of interest varying only slowly.

DESCRIPTION OF THE PREFERRED EMBODIMENT

Figures 1, 2:
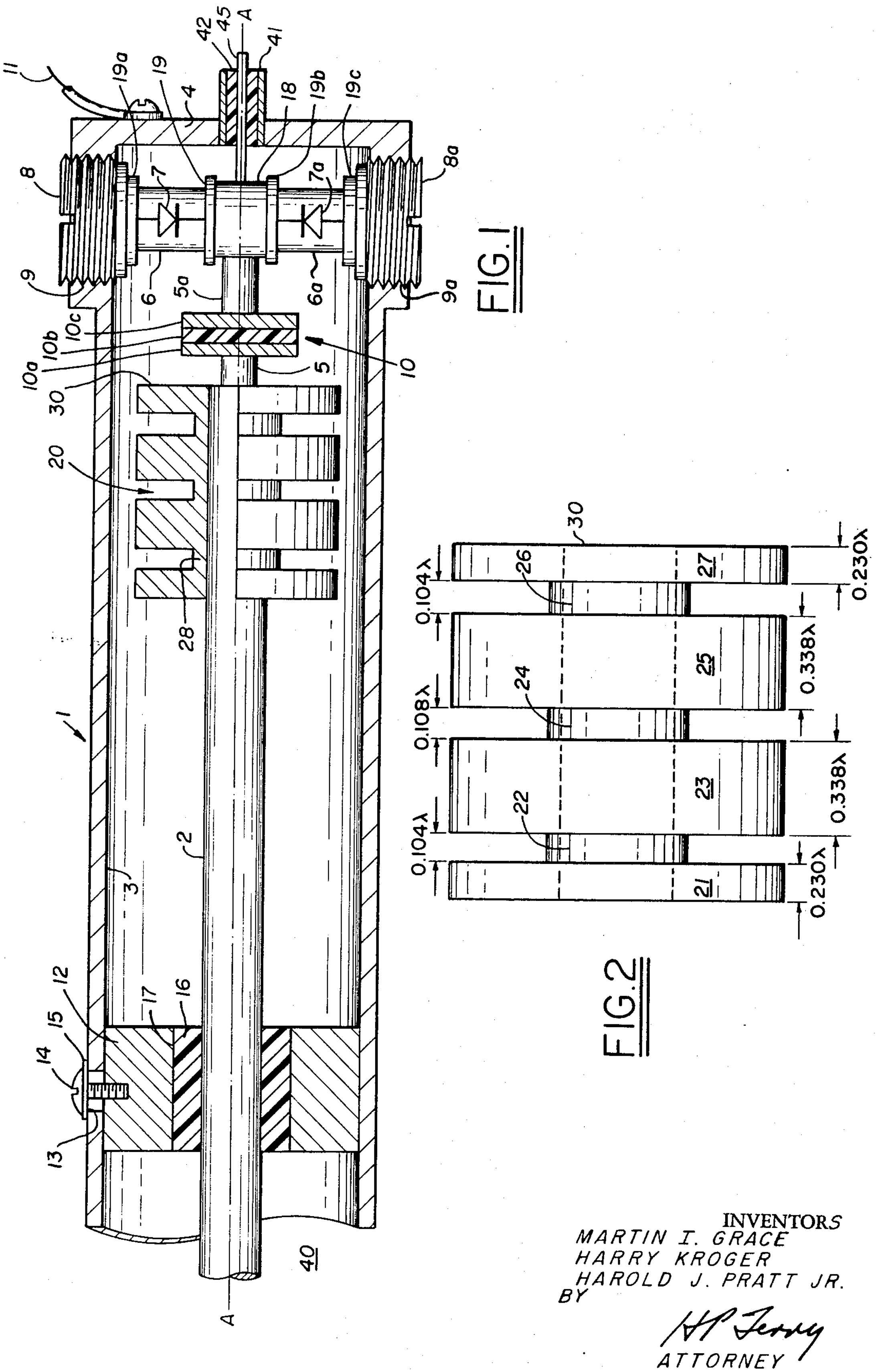
FIG. 1 is an elevation view, partly in cross-section, of a preferred embodiment of the invention.
FIG. 2 is an enlarged view of a portion of the device of FIG. 1.

FIG. 1 illustrates a preferred embodiment of the invention in a form employing a network system with general circular symmetry about dot-dash line A—A within a high frequency or microwave coaxial transmission line 1. Coaxial transmission line 1 consists of a composite inner conductor 2, which may be principally in the form of a round rod, and an outer hollow tubular conductor 3. Propagating high frequency energy is confined within the space between the concentric conductors 2 and 3, the structure being closed at one end by end wall 4. As is the usual practice in constructing high frequency circuit structures, the respective current-carrying surfaces of conductors 2 and 3 and of end wall 4 have good electrical conductivity for such high frequency electrical currents. The impedance of transmission line 1 may be, for example about 50 ohms.

Inner conductor 2 is supported at one end within an impedance matching transformer 12 in insulated relation with respect to outer conductor 3, as will be further discussed. At its end opposite transformer 12, the continuation 5a of inner conductor 2 is supported by a radial diode assembly in circuit with the conducting diode seat 18, the diode assembly comprising high-efficiency-mode semiconductor diodes 6 and 6*a*. Diodes 6 and 6*a* are electrically poled as symbolically indicated by the respective representations 7 and 7*a* shown as if actually drawn on the surfaces of the diode packages. At one of its ends, diode 6 is conductively supported in a conventional manner by the face 19 of diode seat 18. Diode 6 is conductively supported at its opposite end by the face 19*a* of conductive screw 8. Similarly, diode 6*a* is supported in conductive contact by the face 19*b* of diode seat 18 and at its opposite end by the face 19*c of screw 8a*. Screw 8 is threaded through an aperture 9 in the wall of outer conductor 3, while screw 8*a* is similarly threaded through a diametrically located aperture 9*a* on the opposed side of the same wall 3.

At a certain location with respect to diodes 6 and 6*a*, there is provided an adjustable tuning or impedance transforming element 12 whose length is one quarter wave length at the mid-operating value of fundamental frequency $f_F$. Transformer element 12 comprises a circularly ring-shaped element whose outer diameter permits it to be inserted in contact with the inner wall of conductor 3. Where line 1 has a 50-ohm impedance, transformer 12 may have, for instance a 19-ohm impedance. Like conductor 3, its surfaces exposed to high frequency currents are made of a good high-frequency-current conducting material. Tuner element 12 may be provided with means permitting it to be translated longitudinally for adjustment purposes within transmission line 1. A short longitudinal slot 13 cut through wall 3 permits tuner element 12 to be adjusted in position and then to be fastened by tightening screw 14 against washer 15, screw 14 being threaded into a mating threaded hole in element 12. Additional matching elements generally of the above described kind may be used. Furthermore, a single, quarter wave transformer device 112 mounted on the inner conductor 2 of transmission line 1 may be employed where a fixed position device is satisfactory, as will be discussed in connection with FIG. 6.

Still referring to FIG. 1, a dielectric tube 16 may be fastened within tuner 12 at surface 17 by cementing or by other known means. Left free to slide on the surface of inner conductor 2, tube 16 forms a convenient support for inner coaxial conductor 2 within conductor 1. In place of the metallic electrically conducting tuner 12, dielectric tuner or impedance matching devices may be substituted and may similarly be used to fix the relative positions of conductors 2 and 3. If such a dielectric means of support is not employed, a conventional dielectric bead (not shown) may be placed to the left of tuner 12 adjacent an input-output connection to the amplifier.

Semiconductor diodes of the type exhibiting high-efficiency-mode operation or known as avalanche transit time diodes are found to have characteristics suitable for use in the invention as diode 6 and diode **6*a*. They may be used in the form, for example, of the trapped plasma avalanche triggered transit diode known as the TRAPATT diode. Diodes 6 and 6*a*** may be epitaxial silicon or other PN or step or abrupt junction diodes or PNN− punch-through diodes designed such that, with an electric field of suitable amplitude present, the field punches through a substrate at reverse break down. Such diodes have, for example, been described as being successfully formed by diffusing boron from a boron-nitride source into a phosphorous-doped epitaxial material on a heavily doped antimony substrate. The thickness of the epitaxial layer is varied by etching, prior to diffusion, so as to produce either the abrupt PN structure or the PNN+ structure.

A low pass or band pass filter 20 is placed on center conductor 2 in close proximity to diodes 6 and **6*a*. It is understood that the distributed filter 20 may be a three or multiple section low-pass filter of the well known Tchebycheff type, though other filters having related properties may be employed. It is further to be understood that filter 20 may pend from the inner conducting surface of outer coaxial conductor 3, if desired. Either kind of suspension may be constructed so that the filter is translatable longitudinally for adjustment purposes, for example, in the general manner in which impedance transformer 12** is made adjustable.

Filter 20 is comprised of alternate disc-shaped elements of a first characteristic impedance level, with interposed elements each of a second characteristic impedance level. In the form shown in FIGS. 1 and 2, the large diameter discs 21, 23, 25, and 27 may be selected to have an impedance of 19 ohms, for example. The intervening small diameter discs 22, 24, and 26 have an impedance of about 50 ohms, depending upon how thin the wall can conveniently be made; i.e., they have substantially the same impedance as the inner conductor 2. If filter 20 is fixed permanently to conductor 2, the discs 21, 23, 25, and 27 may be fastened directly to conductor 2 and the respective walls 28 may be omitted.

As is seen more clearly in FIG. 2, disc 21 may have a 19 ohm impedance and is, in a representative form of the invention, made $0.230\lambda_F$ in length, where $\lambda_F$ is the wave length corresponding to the mid-operating fundamental frequency $f_F$. In the same terms, disc 22 may have a 50 ohm impedance and is $0.104\lambda_F$ long. Disc 23 is 50 ohms and may be $0.338\lambda_F$ long and disc 24 is 19 ohms and may be $0.108\lambda_F$ in axial length. The filter is symmetric about disc 24. Thus, disc 25 is 50 ohms and may be $0.338\lambda_F$ in length, disc 26 is 19 ohms and may be $0.104\lambda_F$ in length, and disc 27 is 50 ohms and may be $0.230\lambda_F$ in length.

Referring again to FIG. 1, the circuit connection between filter 20 and the diode seat 18 and thus with diodes 6 and **6*a* will be considered. It will be appreciated by those skilled in the art that a relatively short connection is generally desired between filter 20 and diodes 6 and 6*a*. It will further be understood that the relative dimension shown in the drawing of FIG. 1** are not intended to represent actually scaled or preferred dimensions and that the drawing has been made for the convenience of making clear the nature of the relations of the several parts of the circuit.

At the face 30 of filter 20, inner conductor 2 is axially extended as a diminished diameter conductor 5 to which one plate **10*a* of a condenser 10 is soldered or otherwise conductively affixed. Condenser 10 may be any of the several commercially available coaxial condensers available on the market having a dielectric layer 10*b* separating conductive plates 10*a* and 10*c*. Plate 10*c* is conductively fixed at its center to a short rod 5*a* joined, in turn, conductively to diode seat 18. As will be seen, the ceramic condenser 10 provides a lumped capacitance $C_1$ in the circuit, while conductors 5 and 5*a*** cooperate to provide a lumped inductance $L_1$.

It will be understood that the novel energy converter 45 shown in FIG. 1 may be operated as an oscillator by extracting high frequency signals from coaxial line 1 through a suitable transmission line (not shown) coupled to transmission line 1 at the left end of the latter. It will also be understood by those skilled in the art that a leftward extension of coaxial line 1 may be coupled directly to a conventional high frequency signal circulator. One port of the circulator may be used in the conventional manner to inject signals to be amplified into the signal converter 40, while a second port of the circulator is used to couple out the amplified signals and to supply them to a utilization device.

As noted above, a suitable bias voltage must be applied across each of diodes 6 and **6*a* in FIG. 1, wherein an electrical lead 11 represents one connection for supplying such a bias voltage. In the apparatus of FIG. 1, the other lead 45 from the bias battery or power supply (not shown) is coupled to diode seat 18. Bias lead 11 is coupled to diodes 6 and 6***a* through the respective conductive screws 8 and 8*a*. The cooperating bias lead 45 is conductively fastened within the diode seat 18 and forms part of a capacitive bypass system, being surrounded by an insulating sleeve 42 and further surrounded by a tubular element 41 conductively attached within a bore in the end wall 4. Thus, bias voltages are admitted to diodes 6, 6*a* without loss of high frequency energy from transmission line 1, 2.

In the quiescent state of the apparatus 40 of FIG. 1, with substantially no signal at the fundamental frequency $f_F$ present, substantially no unidirectional current flows through diodes 6 and 6*a*, so that power is not wasted. When high frequency energy of fundamental frequency $f_F$ is present within transmission line 1, the electrical fields across the junctions of diodes 6 and 6*a* are summations of the unidirectional bias electrical field and alternating field harmonic components of high frequency signal $f_H$. Whenever the time rate of increase and peak fields across the junctions of diode 6 and 6*a* exceed a critical value, an avalanche shock wave is generated, causing the electric field within diodes 6 and 6*a* to fall instantaneously to a very low value.

Consequently, a large current impulse is allowed to flow from this bias voltage source through diodes 6 and 6*a*. This current surge is abrupt and is therefore rich in harmonic content, so that harmonic high frequency fields are readily generated in the vicinity of diodes 6 and 6*a*. Amplification of any high frequency signal present in transmission line 1 obtains, causing even small excursions of the fundamental frequency $f_H$ signal relative to the break down voltage of diodes 6 and 6*a* to produce a relatively large swing of current flow through the diodes. There being a wide swing in the diode current from its quiescent value of substantially zero, amplification and multiplication production of harmonic signals is an efficient process.

The high frequency energy converter 40 of FIG. 1 will be seen to have two basic properties which are required for wide band, high efficiency mode operation. First, the circuit impedance of the high frequency structure is the conjugate of the impedance of the high efficiency mode diodes 6 and 6*a* in the vicinity of the important operating frequencies of the device; i.e., at the fundamental frequency $f_F$ and at certain harmonic frequencies $f_H$ proximate frequency $f_F$. Furthermore, the operating impedance of the circuit near the fundamental and harmonic frequencies of interest does not vary rapidly as a function of frequency.

It is seen that the circuit illustrated in FIG. 1 has two additional properties that are of important practical value. The tuning of the effective circuit for the fundamental frequency $f_F$ and for each of the important harmonic frequencies $f_H$ can be achieved independently. In other words, the adjustment of the elements constituting the resonant circuit for one of these frequencies is substantially independent of the adjustment of the resonant circuit operating at another. Thus, a tuning adjustment of one such effective resonant circuit does not narrow or shift the resonance curve employed by the other such frequency. Circuit elements such as those interposed between the face 30 of filter 20 and the diodes 6 and 6*a* are electrically short; i.e., less than λ18 at the highest frequency of interest. These circuit elements 5, 5*a*, and 10 are effectively lumped constant elements whose impedance functions have relatively slowly varying dependence upon frequency. It is seen that the circuit of the FIG. 1 apparatus has the property of independently resonating the diodes at the fundamental frequency $f_F$ and at the second and third harmonics thereof while presenting a minimum reactance slope to diodes 6 and 6*a* at each of these frequencies.

Figure 3A:
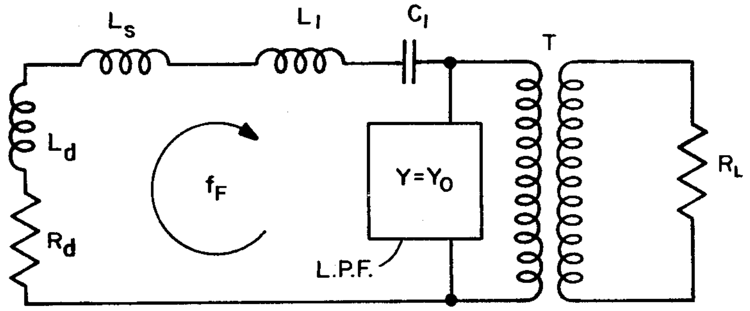
FIGS. 3*a*, 3*b*, and 3*c* are equivalent circuit diagrams useful in explaining the operation of the embodiment of FIG. 1.
Figure 3B:
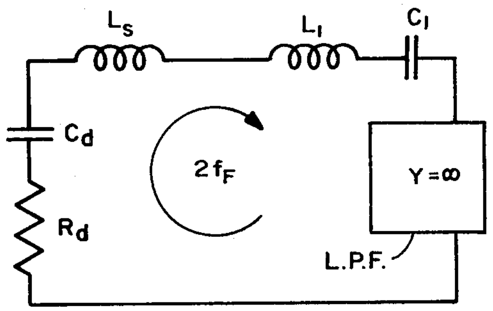
Figure 3C:
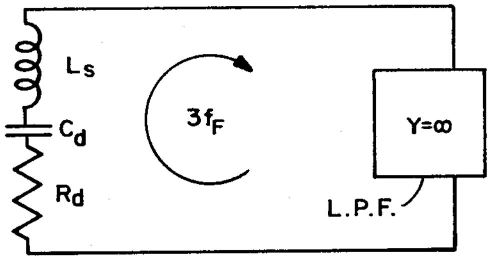

The relations of the particular circuit elements excited at the fundamental and harmonic frequencies may be understood by examination of FIGS. 3*a*, 3*b*, and 3*c*. In those figures, the following parameters are used:

$L_d$ = diode effective inductance,
$R_d$ = diode effective resistance,
$C_d$ = diode effective capacitance,
$L_s$ = diode lead effective inductance
$L_1$ = effective inductance of lead 5, 5*a*,
$C_1$ = effective capacitance of capacitor 10,
Y = admittance of low pass filter 20
$Y_o$ = characteristic admittance of line 1, 2,
$R_L$ = load resistance.

Referring to FIG. 1, it is seen that the diodes 6 and 6*a* appear in parallel at the fundamental frequency $f_F$ and are largely inductive. Therefore, the high frequency circuit of the energy converter 40 is adjusted so as to present to the diodes 6 and 6*a* at the fundamental frequency $f_F$ a circuit which may be represented by the equivalent circuit shown in FIG. 3*a*. The low pass filter L.P.F. which corresponds to filter 20 of FIG. 1 whose cut off frequency lies between the fundamental frequency $f_F$ and the harmonic frequency $2f_F$, is located between the series circuit comprising inductance $L_1$ and capacitor $C_1$ and the transformer T. The latter transformer corresponds to the impedance matching transformer 12 of FIG. 1. Filter L.P.F. is transparent to the fundamental frequency $f_F$ so that its admittance at that frequency is equal to the characteristic admittance of coaxial transmission line 1, 3 ($Y = Y_o$). However, the input admittance of filter L.P.F. is a short circuit at the respective second and third harmonics $2f_F$ and $3f_F$, as indicated in FIGS. 3*b* and 3*c* by the notation $Y = \infty$. The reactance of the $L_1$–$C_1$ series network is chosen such that it is the conjugate of the net diode reactance. Transformer T simply transforms the load resistance $R_L$ to a value yielding the required over all gain, as does impedance matching transformer 12 of FIG. 1.

At the second harmonic frequency $2f_F$, the equivalent of the high frequency circuit of FIG. 1 is seen in FIG. 3*b*. As noted above, the input admittance of low pass filter L.P.F. is that of a short circuit. Thus, second harmonic energy is not coupled through transformer T into load $R_L$. The series $L_1$–$C_1$ circuit exhibits and inductive reactance sufficient to resonate the net diode reactance, which is capacitive at the harmonic frequency $2f_F$. Diodes 6 and 6a are selected to be self-resonant at the third harmonic frequency $3f_F$. It is seen that this desired resonance property of diodes 6 and 6a isolates them from the external circuit load $R_L$. In FIG. 3c, no current can flow in the external circuit and none is coupled to load $R_L$. The balanced diode circuit is thus instrumental in preventing harmonic current flow into the external circuit.

Referring again to FIG. 1, it is seen that filter 20 is placed proximate to diodes 6 and 6a and is chosen so that:

a. the operating fundamental frequency $f_F$ of the energy converter falls in the pass band of filter 20, and b. the stop band of filter 20 contains at least the second and third harmonics of frequency $f_F$.

The latter adjustment retains all harmonic energy but the fundamental in the region about diodes 6 and 6a and especially, when the input impedance of filter 20 at the third harmonic is that of a short circuit, permits efficient operation of diodes 6 and 6a without the appearance of harmonic energy in the output of the amplifier. Thus, the band stop properties of filter 20 successfully confine all third harmonic current flow to the diodes 6 and 6a.

Figure 4:
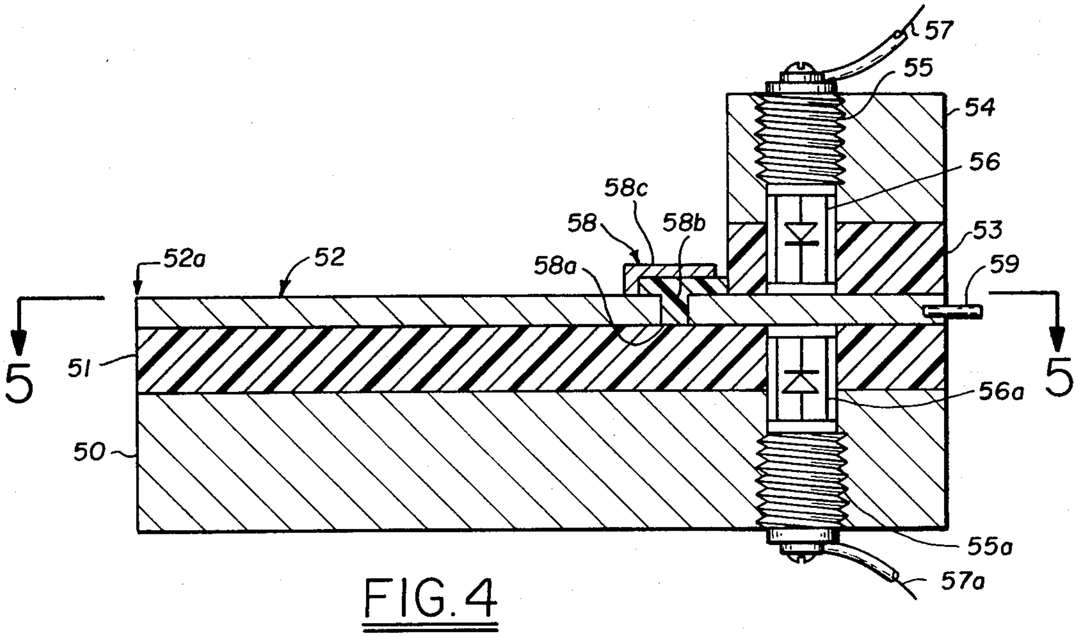
FIG. 4 is an elevation view, largely in cross section, of an alternative form of the device of FIG. 1.
Figure 5:
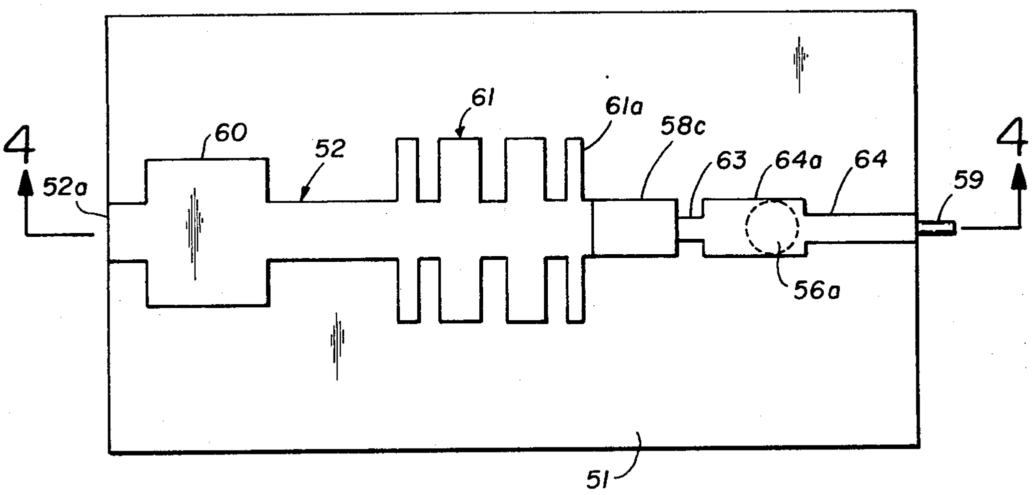
FIG. 5 is a partial plan view of the device of FIG. 4 taken along the line 5—5 thereof.

The versatility of the novel energy converter is further illustrated in FIGS. 4 and 5 in an embodiment similar in principle to that of FIG. 1 by employing a planar transmission line circuit 52. It will be seen in discussing the structure shown in FIGS. 4 and 5 that the energy converter shown therein consists, in part, of a single ground plane microstrip transmission line 52 and in part of a transmission line section supporting balanced high efficiency mode diodes 56 and 56a and therefore being constructed as a symmetric strip transmission line.

As seen particularly in FIG. 4, the planar transmission line circuit per se comprises at least a dielectric substrate 51, to one surface of which a ground sheet 50 may be bonded in any well known manner. For example, ground sheet 50 may be formed on one surface of dielectric substrate 51 by evaporation in a vacuum chamber from a heated source for distilling a desired electrically conductive metal, or by chemical or by other known metal plating methods for forming a high electrical conducting metal layer of either silver or gold and having a thickness of several skin depths at the operating frequency of the apparatus.

The transmission line system 52 opposite ground plane 50 comprises planar or microstrip transmission line elements, bonded to the second or upper surface of insulating substrate 51. It will be understood that the thicknesses of certain of the layers illustrated in FIG. 4, such as layers 51 and 52, are grossly exaggerated as a matter of convenience in making the drawing clear. The width of the transmission line 52 is determined by the usual standards which must be met for causing the high frequency energy propagating along transmission line 52 to be firmly bonded thereto and to propagate substantially in TEM mode.

It is to be understood that substrate 51 and ground plane 50 may be extended in any direction to support additional active or passive circuit elements desirable for coupling, for instance, at end 52a of transmission line 52. The dielectric material of substrate 51 may comprise an aluminum oxide ceramic or other similar material having physical properties suitable for exposure to elevated temperatures in the evaporation process and having low dielectric loss tangents.

Referring now particularly to FIG. 5, there is illustrated the planar energy converter as it would be seen if insulating layer 53, upper ground plane 54, and diode 56 of FIG. 4 were removed, thus exposing the entire upper surface of substrate 51 except for the surface covered by transmission line 52 and thus also making all of transmission line 52 visible. Following the input 52a of transmission line 52 is a planar impedance matching transformer 60, analogous to transformer 12 of FIG. 1. Transformer 60, comprising a symmetric enlargement of line 52, has a length of one fourth wave at the fundamental frequency $f_F$. The impedance transformer 60 is connected to a continuation of transmission line 52 corresponding generally in impedance level to the impedance level of line 52 at input 52a. Spaced along line 52 from transformer 60 is a planar low-pass filter 61 which may be designed according to the Tchebycheff filter design technique in a manner analogous to that in which the low-pass filter 20 in FIG. 1 is designed.

At the output of low pass filter 61, the original impedance level of the planar transmission line 52 is resumed. However, as seen in both FIGS. 4 and 5, transmission line 52 is broken at location 58a so that a capacitor 58 is formed. Capacitor 58 includes an over layer 58b of insulating material such as aluminum oxide or titanium dioxide which extends into the gap 58a. In order to complete the capacitive coupling between filter 61 and the next following section 63 of transmission line 52, a metallic over layer 58c is placed on top of the insulation material 58b and is conductively joined at one of its ends, substantially at the output plane 61a, to filter 61. Transmission line 52 is now continued by an inductive section 63 coupled only to the first portion of line 52 via condenser 58. Capacitor 58 and the inductive section 63 of transmission line 52 are seen to correspond to capacitor 10 and to the inductive line sections 5 and 5a of FIG. 1. Likewise, they correspond to the lumped constant capacitor $C_1$ and to inductance $L_1$ of FIG. 4a.

Transmission line 52 is continued by a section of planar circuit 64a having a width sufficient for forming conductive seats against diodes 56 and 56a. The planar material circuit is continued at 64 by a relatively high impedance lead supporting terminal 59, at which a bias voltage suitable for biasing diodes 56 and 56a may be attached.

As seen particularly in FIG. 4, the section of the energy converter associated with diodes 56 and 56a comprises a symmetrically balanced strip line section, which begins substantially at the location of the planar inductive section 63. The lower diode 56a is held in good electrical contact against the lower surface of diode seat 64a by virtue of the fact that ground plane 50 and the insulating substrate 51 have been provided with a bore for accommodating diode 56a, the lower portion of the bore being supplied with threads so that threaded plug 55a may be used to urge diode 56a firmly against the lower face of diode seat 64a. Ground plane 50 or the threaded plug 55a may be used as a connection for a lead 57a used for enabling a bias voltage to be placed on one side of diode 56a.

As previously stated, the upper portion of the symmetric strip line begins in the vicinity of inductance 63. It comprises an insulating layer 53 similar to insulating layer 51 and bonded thereto and over a corresponding portion of transmission line 52. Insulating layer 53 may be formed of a mechanically shaped block of insulating material and may then be bonded to layer 51 and circuit 52 by well known means. On the other hand, insulating layer 53 may be applied by vacuum or sputtering deposition according to well known methods. Joined to insulating layer 53 in a manner similar to the way in which ground plane 50 is joined to insulating layer 51 is an upper ground layer 54. As in the instance of layers 50 and 51, layers 53 and 54 are provided with a bore for accommodating diode 56, held in place within the upper ground plane 54 by the threaded plug 55. Plug 55 may be supplied with a bias lead 57 similar to bias lead 57*a*.

The operation of the embodiment of FIGS. 4 and 5 may be explained in the manner used in explaining the operation of the coaxial line converter of FIG. 1. The respective sizes and locations of the elements of transmission line 52 are analogous to the sizes and locations of corresponding elements in the converter of FIG. 1. Furthermore, the manner of operation of the individual effective equivalent circuits at the fundamental frequency $f_F$ and at the harmonics $2f_F$ and $3f_F$ is readily explained by again using the equivalent circuits of FIGS. 3*a*, 3*b*, and 3*c* and the previously developed explanations of them. It will be seen in FIGS. 4 and 5 that filter 61 is placed proximate diodes 56 and 56*a* and is chosen so that the operating fundamental frequency $f_F$ falls in the pass band of filter 61 and that the stop band of filter 61 contains at least the second and third harmonics of frequency $f_F$. It is seen that because of the structure of capacitance 58 and inductance 63, all harmonic energy but that of the fundamental frequency signal is retained in the circuit adjacent diodes 56 and 56*a* so that high efficiency mode operation of diodes 56 and 56*a* is facilitated without the appearance of harmonic energy at the plane 52a of the converter.

Figure 6:
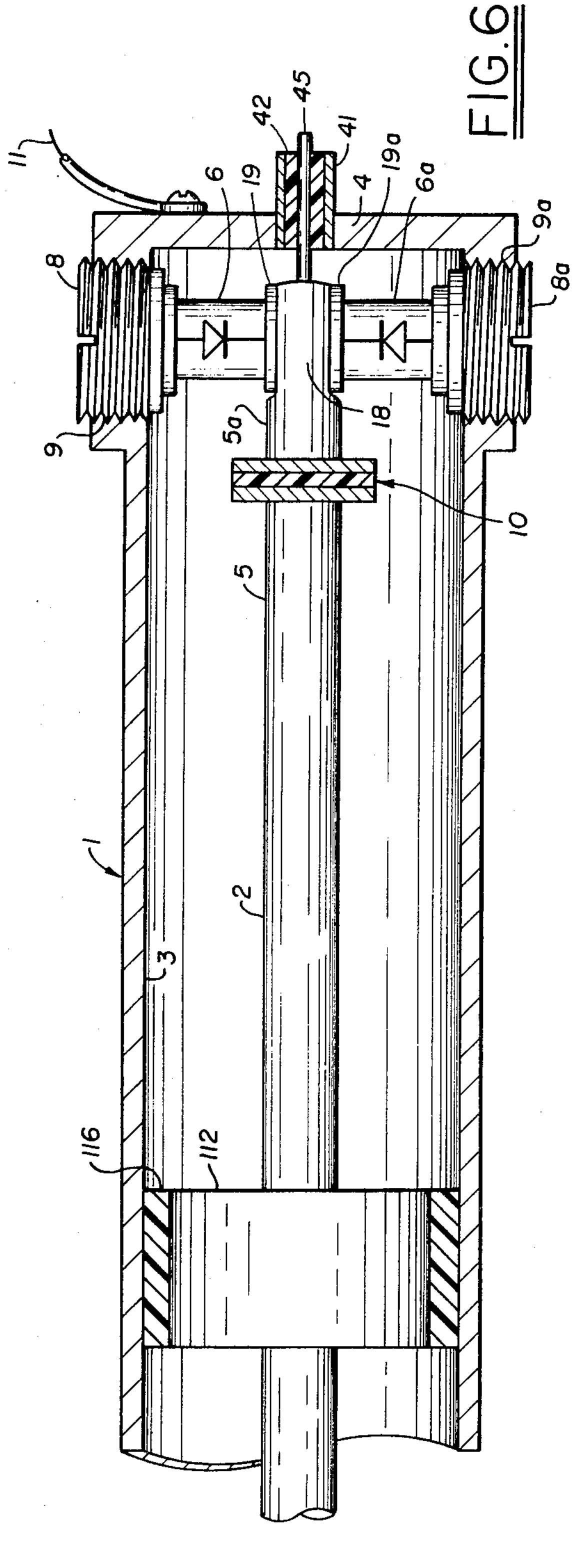
FIG. 6 is an elevation view, partly in cross section, of an alternative form of the apparatus of FIG. 1.

In certain types of operation, it is found necessary to provide matching at all three frequencies $f_H$, $2f_H$, and $3f_H$, but it is found that efficient high frequency mode operation may be attained in other circumstances by matching only at the fundamental frequency $f_F$ and at the second harmonic $3f_F$. A version of the energy converter of FIG. 1 operating without a circuit matching at harmonic frequency $2f_F$ is shown in FIG. 6. In general, the apparatus of FIG. 6 includes many of the elements used in FIG. 1, omitting others. Those elements used in common in FIGS. 1 and 7 are identified by corresponding reference numerals. Such common elements particularly include coaxial conductors 2 and 3, end wall 4, conductor portions 5 and 5*a*, diodes 6 and 6*a*, threaded plugs 8 and 8*a*, threaded bores 9 and 9*a*, capacitor 10, diode bias lead 11, diode bias lead 45 forming a bypass device in cooperation with elements 41 and 42, and diode seat 18.

In FIG. 6, high efficiency mode diodes 6 and 6*a* are placed in balanced connection with inner conductor 2, as in the apparatus of FIG. 1, in parallel with the components of the main coaxial transmission line 1. Lumped capacitor 10 having an effective capacitance value $C_1$ is at the diode seat 18 in close proximity to diodes 6 and 6*a*. The portions 5 and 5*a* of the inner conductor 2 have substantially the same diameter as conductor 2 and therefore not longer represent a lumped inductance.

Figure 7A:
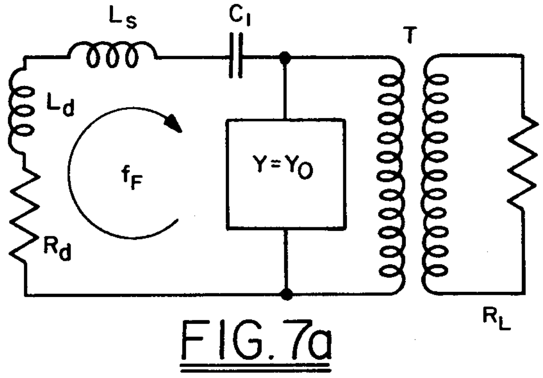
FIGS. 7*a* and 7*b* are equivalent circuit diagrams useful in explaining the operation of the device of FIG. 6.
Figure 7B:
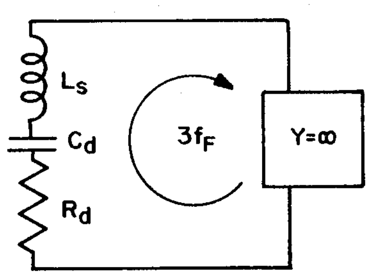

It is seen upon inspection of the equivalent circuits for the FIG. 6 apparatus shown in FIGS. 7*a* and 7*b*, that the apparatus of FIGS. 1 and 6 operates in a generally similar manner. In FIG. 7*a*, even without the lumped inductance $L_1$ of FIG. 3*a*, the energy of fundamental frequency $f_F$ is coupled to load $R_L$, since the admittance Y of the circuit is equal to $Y_o$. The circuit is now matched only for the harmonic frequency $3f_F$, as is seen from the equivalent circuit of FIG. 7*b*, in such a manner that the energy of harmonic frequency $3f_F$ is retained in the vicinity of diodes 6 and 6*a*.

Figure 8:
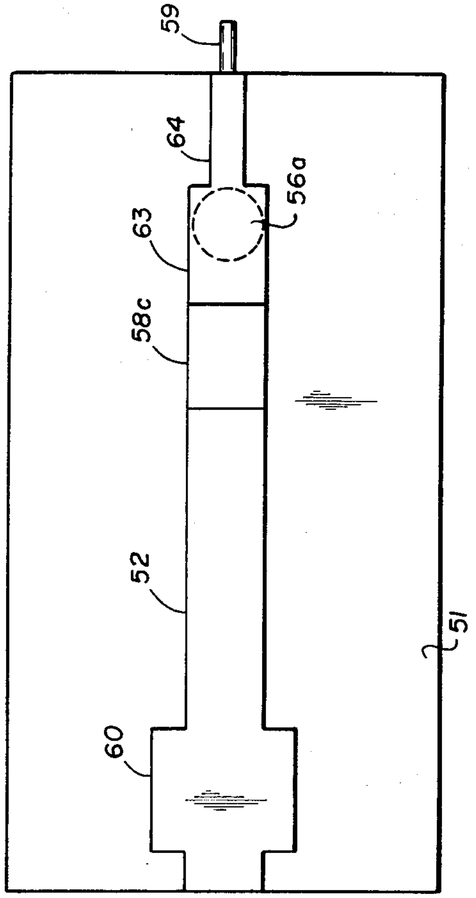
FIG. 8 is a partial plan view of an alternative form of the device of FIG. 5.

A planar circuit also operating according to the same principles as the circuit of FIG. 6, but constructed like that of FIGS. 5 and 6, is shown in FIG. 8. It may be observed that the elevation cross section of FIG. 8 configuration duplicates that of FIG. 4. Parts in FIG. 8 which correspond to those of FIGS. 4 and 5 have similar reference numerals. In FIG. 8, it is seen that the filter 61 of FIG. 5 is eliminated, as is the reduced width inductive element 63.

It will be understood by those skilled in the art that the several novel embodiments of the invention utilize the beneficial properties of high efficiency mode active diode elements in a balanced configuration using lumped circuit elements, along with the diode circuit characteristics, to provide wide band amplification. The high efficiency mode circuits in the several embodiments have impedances which are the conjugates of the impedance of the associated active diodes in the vicinity of the fundamental frequency $f_F$ and of both of the harmonic frequencies $2f_F$ and $3f_F$, if both are present. Broad band operation is further enabled because the impedance of the circuits in the neighborhood of the frequencies of interest does not rapidly vary as a function of frequency. Independent tuning for each of the important frequencies is readily achieved. Electrically short elements are employed in the circuits as an aid to increasing band width.

While the invention has been described in its preferred embodiments, it is to be understood that the words which have been used are words of description rather than of limitation and that changes within the purview of the appended claims may be made without departure from the true scope and spirit of the invention in its broader aspects.

We claim:

1. A broad band high efficiency mode amplifier for amplifying signals of frequency $f_F$ comprising:
   - high frequency transmission line means having first and second co-extensive conductor means,
   - avalanche semiconductor diode means coupled between said first and second co-extensive conductor means,
     - said semiconductor diode means being characterized by an inductive reactance at a predetermined frequency $f_F$, a capacitive reactance at harmonic frequency $2f_F$ thereof, and self-resonance at harmonic frequency $3f_F$ thereof,
   - said first co-extensive conductor means including series connected inductor-capacitor circuit means for resonating the net reactance of said semiconductor diode means at harmonic frequency $2f_F$,
   - said first co-extensive conductor means including high impedance conductor means coupled at the common junction between said inductor-capacitor circuit means and said semiconductor diode means in insulated relation with respect to said second conductor means for enabling application of a unidirectional biasing electric field across said semiconductor diode means, filter means adjacent said series inductor-capacitor circuit means for propagating said signal of frequency $f_F$ and cooperating with said first and second co-extensive conductor means for retaining signal energy of said harmonic frequencies $2f_F$ and $3f_F$ in the vicinity of said semiconductor diode means, and impedance matching transformer means cooperating with said first and second co-extensive conductor means and spaced from said filter means opposite said semiconductor means.

2. Apparatus as described in claim 1 wherein:

said first and second co-extensive conductor means respectively comprise substantially coaxial inner and outer conductor means, and said semiconductor diode means is conductively connected between said series connected inductor-capacitor circuit means and said outer coaxial conductor means.

3. Apparatus as described in claim 2 wherein said semiconductor diode means comprises first and second diode means radially and oppositely connected between said series connected inductor-capacitor circuit means and said outer coaxial conductor means.

* * * * *